(12) United States Patent
Puech et al.

(10) Patent No.: US 7,892,980 B2
(45) Date of Patent: Feb. 22, 2011

(54) APPARATUS AND A METHOD FOR CONTROLLING THE DEPTH OF ETCHING DURING ALTERNATING PLASMA ETCHING OF SEMICONDUCTOR SUBSTRATES

(75) Inventors: Michel Puech, Metz-Tessy (FR); Nicolas Launay, Annecy (FR)

(73) Assignee: Tegal Corporation

( * ) Notice: Subject to any disclaimer, the term of this patent is extended or adjusted under 35 U.S.C. 154(b) by 1409 days.

(21) Appl. No.: 11/319,506

(22) Filed: Dec. 29, 2005

(65) Prior Publication Data

US 2006/0175010 A1    Aug. 10, 2006

(30) Foreign Application Priority Data

Dec. 31, 2004    (FR) .................................. 04 53276

(51) Int. Cl.
*H01L 21/302* (2006.01)
(52) U.S. Cl. ...................... 438/710; 438/706; 438/712; 216/59; 216/60
(58) Field of Classification Search .................... 438/3, 438/706, 710, 712, 714, 707, 789; 216/59, 216/60
See application file for complete search history.

(56) References Cited

U.S. PATENT DOCUMENTS

| | | | |
|---|---|---|---|
| 6,200,822 B1 | 3/2001 | Becker | |
| 6,406,924 B1 * | 6/2002 | Grimbergen et al. | ........... 438/9 |
| 6,720,268 B1 | 4/2004 | Laermer | |
| 6,835,275 B1 * | 12/2004 | Grimbergen et al. | ... 156/345.24 |
| 6,977,184 B1 * | 12/2005 | Chou et al. | ..................... 438/9 |
| 2004/0238489 A1 * | 12/2004 | Johnson et al. | ............... 216/60 |

FOREIGN PATENT DOCUMENTS

EP    1 420 438 A2    5/2004

* cited by examiner

*Primary Examiner*—Lan Vinh
(74) *Attorney, Agent, or Firm*—Fliesler Meyer LLP

(57) ABSTRACT

The present invention provides apparatus for controlling the operation of plasma etching a semiconductor substrate by an alternating etching method, the apparatus comprising:
a process chamber (1) in which said substrate (2) is processed,
means for generating a plasma (6);
at least one first window (7) formed in a first wall (8) of said chamber (1) facing the surface (2*a*) to be etched of said substrate (2);
at least one second window (10) formed in a second wall (11) of said chamber (1) lying in a plane different from said first wall (8);
first means (18) coupled to said second window (10) to detect a light signal (17) relating to a selected wavelength emitted by said plasma (6);
means (13, 15) for emitting a monochromatic light signal (14) through said first window (7) towards said surface (2*a*) in a direction (9) substantially perpendicular to said surface (2*a*) in such a manner that said incident signal (14*a*) is reflected on said surface (2*a*);
second means (16) for detecting said reflected signal (14*b*); and
transformation means (19) coupled to said first means (18) and to said second means (16) to transform the signal detected by said second means (16) as a function of the signal detected by said first means (18).

19 Claims, 1 Drawing Sheet

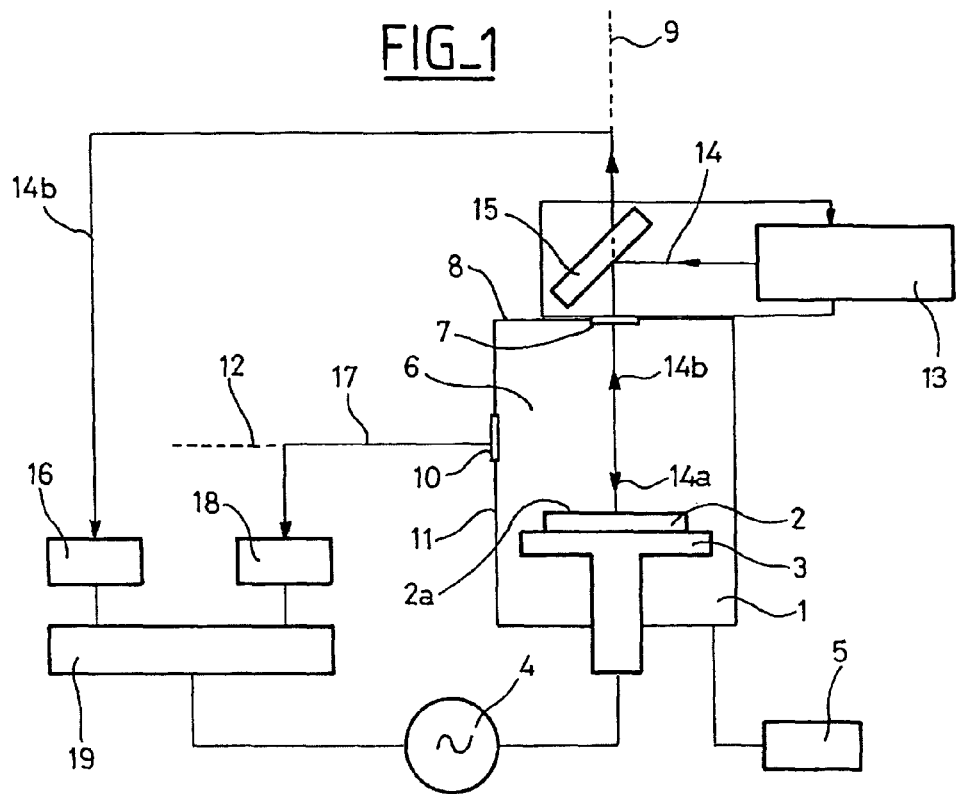
FIG_1
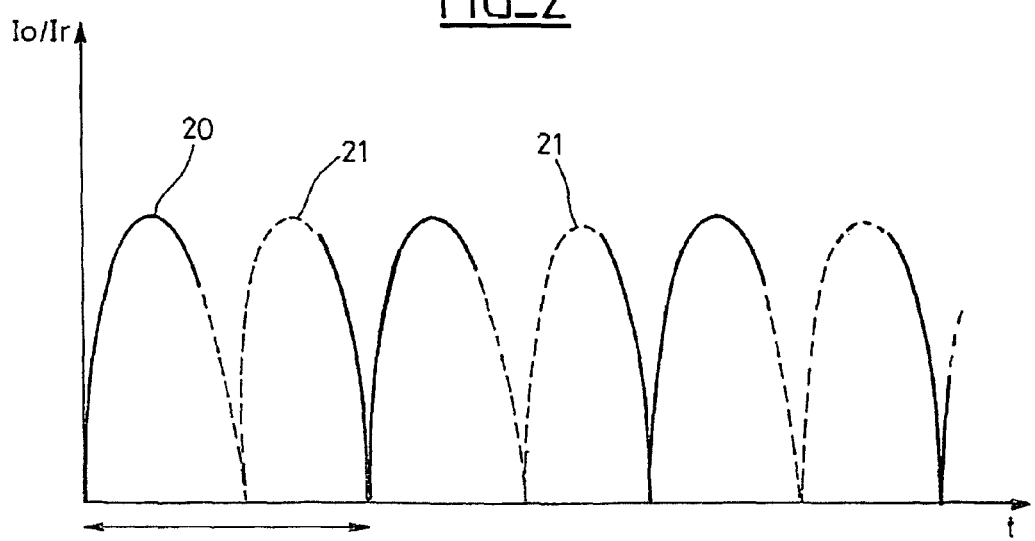
FIG_2

APPARATUS AND A METHOD FOR CONTROLLING THE DEPTH OF ETCHING DURING ALTERNATING PLASMA ETCHING OF SEMICONDUCTOR SUBSTRATES

The present invention relates to the field of micromachining semiconductor substrates to make components for microelectromechanical systems (MEMS) or for microoptical electromechanical systems (MOEMS). The invention relates more particularly to controlling the depth of etching during micromachining of silicon by plasma using the alternating etching technique, and in particular the invention relates to the apparatus and to the method used.

Integrated circuits are made in the bulk of semiconductor material wafers. Lines are reproduced on the surface of the wafer in a grid pattern so that the individual integrated circuits, known as "chips", can easily be separated from one another. Once treatment of the wafer has been finished, it is cut up along the lines in order to separate the chips.

Most applications using components etched on silicon substrates require the etched pattern to be of very great precision, in particular in terms of depth. It is therefore necessary to control depth very precisely in order to determine without ambiguity when the etching operation has come to an end. The most widespread method for detecting the end of the etching operation are methods that rely on optical techniques.

One method consists in sending a light beam of uniform frequency, preferably a laser beam, onto a substrate for etching that comprises two distinct layers having different indices of refraction. The beam is reflected therefrom and picked up by a detector. A sudden change in the detected light intensity, due to the change in the index of refraction on passing from one layer to another marks the end of etching.

Proposals have thus been made to use a method based on laser interferometry. In that method, a monochromatic beam generated by a laser is directed substantially perpendicularly onto a semitransparent layer for etching. The partially-reflected beam is picked up by a suitable photodetector. The beams coming from reflection on the surface of the layer of $SiO_2$ and from reflection on the interface between said layer and the substrate interfere so as to give a characteristic sinusoidal curve. The interference phenomenon is controlled by the relationship $d=\lambda/2n$, where $\underline{d}$ is the thickness of the layer to be etched, $\lambda$ is the wavelength of the beam, and $\underline{n}$ is the index of refraction in the propagation medium ($n=1$ in a vacuum). The flattening in the curve indicates that the semitransparent layer has been consumed in full, and thus marks the end of the etching operation.

Another document describes a device for controlling the operation of plasma etching a semiconductor substrate. The treatment chamber has two windows coupled to a spectrometer for observing the plasma. Each spectrometer delivers a signal based on the wavelength of a selected species in the radiation of the light-emitting discharge. The first window, observing in a plane parallel to the surface of the substrate, provides a signal relating to variation in intensity during etching at a selected wavelength. The second window, observing in a plane normal to the surface of the substrate, gives a signal containing information relating to the variation in the intensity of the selected wavelength and to the variation in the reflectivity of the layer of $SiO_2$ which is redeposited in continuous manner during the treatment. By interferometry, a signal is obtained relating to the variation over time in the intensity of the surface reflectivity of the wafer, and thus relating to the thickness of the $SiO_2$ layer which depends thereon directly. Means enable the depth of the etching and the thickness of the $SiO_2$ layer to be deduced therefrom.

Micromachining silicon using a plasma, also known as deep reactive ion etching (DRIE) commonly makes use of an alternating etching technique which is characterized by alternating steps of removal and of deposition which follow one another very quickly. That method is described in particular in document U.S. Pat. No. 5,501,893. The technique consists in hiding the silicon substrate in part by means of a mask, and in subjecting the hidden substrate to an alternating succession of etching steps using an etching gas plasma and of passivation steps using a passivation gas plasma. During each etching step, the etching gas plasma such as sulfur hexafluoride $SF_6$ makes cavities in those zones of the substrate that are not hidden by the mask. During each passivation step, the passivation gas plasma, such as a fluorocarbon gas, e.g. $C_4F_8$, deposits a protecting polymer film on the wall of the cavity. Each of the etching and passivation steps has a duration that is very short, a few seconds, and the passivation prevents the etching gas plasma from etching the side wall of the cavity during the subsequent etching step. As a result, etching takes place selectively in the bottom of the cavity after the etching gas plasma has removed the film of protective polymer at the bottom of the cavity. Thus, in spite of the isotropic nature of the way in which silicon is etched by a plasma of an etching gas, such as a fluorine-containing gas, the etching of the silicon that is obtained is, in fact, practically anisotropic, fast, and selective.

The methods of using optical techniques to detect the end of the etching operation in prior art methods are not suitable for use with the alternating etching method since the information provided is disturbed by the alternation, and is therefore unusable.

The problem posed by the present invention is to improve the apparatus and the method for alternating etching of silicon by a succession of etching steps and of passivation steps in such a manner as to provide improved control over the depth to which a semiconductor substrate is etched.

An object of the invention is to provide apparatus for controlling the end of a plasma etching operation on a substrate once the desired depth has been reached.

Another object of the invention is to provide a method that makes it possible in certain and accurate manner to determine the end of the etching operation.

The present invention provides apparatus for controlling the operation of plasma etching a semiconductor substrate by an alternating etching method, the apparatus comprising:
 a process chamber in which said substrate is processed,
 means for generating a plasma;
 at least one first window formed in a first wall of said chamber facing the surface to be etched of said substrate;
 at least one second window formed in a second wall of said chamber lying in a plane different from said first wall;
 first means coupled to said second window to detect a light signal relating to a selected wavelength emitted by said plasma;
 means for emitting a monochromatic light signal through said first window towards said surface in a direction substantially perpendicular to said surface in such a manner that said incident signal is reflected on said surface;
 second means for detecting said reflected signal; and
 transformation means coupled to said first means and to said second means to transform the signal detected by said second means as a function of the signal detected by said first means.

In a first embodiment of the invention, the emitter means comprise a helium-neon laser generating a monochromatic signal having a wavelength of 632.8 nanometers (nm). The emitter means preferably also comprise a semireflecting mirror. The mirror enables the beam emitted by the laser towards the substrate to be reflected and allows the beam reflected by the substrate towards the detector to pass through.

In a second embodiment, the second detector means comprise an interferometer.

In a third embodiment, the first detector means comprise an emission spectrometer.

In a fourth embodiment, the plane of the second window is substantially perpendicular to the plane of the first window.

The invention also provides a method of controlling the operation of plasma etching the surface of a semiconductor substrate by the alternating etching method using the above apparatus, the method comprising the following steps:

generating a monochromatic signal;
sending said signal to the substrate in a direction substantially perpendicular to the surface to be etched;
detecting said signal reflected on said substrate;
detecting a signal associated with the presence in the plasma of a species stemming from the reaction of the etching gas with said substrate; and
extracting from said reflected signal those portions of the signal that corresponds to the presence of said species in order to obtain a curve representative of etching steps alone.

In an implementation of the invention, the substrate is of silicon and the species whose presence is detected during the material-removal step is a species of the $SiF_x$ type, such as $SiF_4$, for example.

In another implementation of the invention, the substrate is of silicon and the species whose presence is detected during the material-removal step is a species of the $CF_x$ type, such as $CF_2$, for example.

The present invention has the advantage of making it possible to obtain a signal which corresponds solely to those periods during which etching is actually taking place, and which consequently provides information that is directly usable.

Other characteristics and advantages of the present invention appear on reading the following description of an embodiment that is naturally given by way of non-limiting illustration, and from the accompanying drawing, in which:

FIG. 1 is a diagram of etching apparatus in which the method of the present invention is implemented; and FIG. 2 is a graph plotting the reconstituted signal as a function of time.

In the embodiment shown in FIG. 1, the installation for micromachining semiconductor substrates comprises a sealed enclosure 1 shaped to receive and contain a semiconductor substrate 2 for etching.

In conventional manner, the substrate 2, e.g. a silicon wafer, is secured on a support 3 that is electrically biased by bias means 4 to a potential that is negative relative to ground. Vacuum generator means 5, connected to the process chamber 1 and comprising for example a primary pump and a secondary pump, serve to create and maintain a suitable vacuum inside the enclosure 1. The substrate 2 is oriented in the chamber 1 in such a manner as to cause its surface 2a for working to be visible. Facing the surface 2a for machining, there are means for generating a plasma 6 that is directed towards the surface 2a for machining. The installation includes means for selectively injecting gases into the chamber 1, in particular etching gases and passivation gases. During the etching step, $SF_6$ is introduced as the etching gas, for example, the plasma 6 contains electrically neutral active atoms such as atoms of fluorine, which propagate in all directions, and ions such as $SF_5^+$ which are attracted to the negatively biased substrate 2 and which attack the silicon. During the passivation steps, a fluorocarbon gas such as $CHF_3$, $C_2F_6$, $C_2F_4$, or $C_4F_8$ is injected which causes a protective polymer film to be formed over the entire etched surface.

In the present invention, the enclosure 1 includes a first quartz window 7 placed over a first wall 8 facing the surface to be etched 2a so as to observe the surface to be etched 2a along an axis 9 which is substantially perpendicular thereto, and a second window 10 disposed in a second wall 11, in this case perpendicular to the wall 8, in such a manner as to observe the plasma 6 along an axis 12, in this case substantially parallel to the axis to be etched 2a.

According to the invention, the installation further comprises means 13 for generating a monochromatic optical signal, in particular a laser diode or preferably a helium-neon laser, for example. The light signal 14 emitted by the laser 13 is directed by means of a semireflecting mirror 15 towards the surface 2a of the substrate 2 through the window 7. The incident signal 14a is reflected on the surface 2a that is being etched, and the reflected signal 14b which is practically totally reflected returns substantially along the same path in the opposite direction. After passing through the window 7, and then through the semireflecting mirror 15, the reflected signal 14b is directed to detector means 16 such as an interferometer by means of an optical fiber, for example. The laser signal is emitted and detected throughout the entire duration of the operation of treating the substrate with alternating etching.

According to the invention, the installation also includes means for observing the plasma 6. The light signal 17 coming from observation of the plasma 6 through the window 10 is directed by means of an optical fiber, for example, to an emission spectrometer 18 which analyses the signal 17 in order to identify the presence of species coming from the reaction of the etching gas with the substrate 2, and in particular the presence of $SiF_4$ in the event of $SiF_6$ being reacted with silicon.

Signal transformation means 19, such as a computer, extract from the signal received by the detector 16 periods during which the spectrometer 18 detects the presence of species coming from the reaction of the etching gas with the substrate 2, and in particular $SiF_4$. This produces a reconstituted laser interferometer signal 20 as shown in FIG. 2 and which corresponds solely to the periods during which the substrate is being etched, to the exclusion of passivation periods 21 and possibly also depassivation periods.

In FIG. 2, the reconstituted signal 20 is plotted as variation as a function in time in the ratio $I_0/I_r$ where $I_0$ is the intensity of the signal 12 emitted by the laser, and $I_r$ is the intensity of the reflected signal 14b received by the detector 16. The distance $\underline{d}$ is a function of the wavelength $\lambda$ of the laser and of the index of refraction $\underline{n}$ of the propagation medium (in this case a vacuum, so n=1), where $d=\lambda/2n$ and represents the thickness of the laser to be etched. The computer 19 analyzes the signal 20 to determine the end of the etching operation.

For example, if the substrate includes a layer of silicon Si placed over a fine buried layer of $SiO_2$, and if the etching operation consists in totally etching the surface layer of silicon Si and stopping at the surface of the $SiO_2$ layer, then the signal 20 will flatten when the $Si/SiO_2$ interface is reached.

If the silicon substrate is uniform and if the etching operation consists in etching the silicon to a determined depth, it is then possible from the signal 20 to estimate the depth that has been etched and thus the almost instantaneous speed of etching $V_i$ by measuring the time $\underline{t}$ that elapses between two extrema, in application of the relationship:

$V_i = d/t = \lambda/2nt$

The present invention is not restricted to the embodiments described explicitly above, but naturally include any variants and generalizations that are within the competence of the person skilled in the art.

What is claimed is:

1. A method of controlling the operation of plasma etching the surface of a semiconductor substrate by an alternating etching method, which comprises an etching portion and a deposition portion, the method comprising the following steps:
   generating a monochromatic signal;
   sending said signal to the substrate in a direction substantially perpendicular to the surface to be etched;
   detecting said signal reflected on said substrate;
   detecting a signal associated with the presence in the plasma of a species stemming from the reaction of an etching gas with said substrate, wherein the associated signal is detected simultaneously with the reflected signal; and
   extracting from said reflected signal those portions of the signal that correspond to the presence of said species in order to obtain a curve representative of etching steps alone.

2. A method according to claim 1, in which said substrate is made of silicon and said species is of the type $SiF_x$.

3. A method according to claim 1, in which said substrate is of silicon and said species is of the type $CF_x$.

4. A method as in claim 1, wherein the reflective signal is detected by an interferometer and the second signal is detected by an emission spectrometer.

5. A method as in claim 1, wherein extracting a signal comprises retrieving a portion of the signal associated with the time that the second signal shows the etching process.

6. A method as in claim 1, wherein the extracted signal provides information regarding at least one of an etch rate and an end of the etching process.

7. A method of controlling the operation of plasma etching in an alternating etching process, which comprises an etching portion and a deposition portion, comprising
   receiving a first signal representative of the alternating etching process;
   simultaneously detecting a second signal indicative of the etching portion of the alternating etching process; and
   using the second signal to extract from the first signal a signal representative of the etching portion within the alternating etching process,
   wherein extracting a signal comprises retrieving a portion of the signal associated with the time that the second signal shows the etching process.

8. A method as in claim 7, wherein the first signal comes from a substrate that underwent the alternating etching process.

9. A method as in claim 7, wherein the first signal is generated from a laser.

10. A method as in claim 7, wherein the first signal is received through an interferometer.

11. A method as in claim 7, wherein the second signal is detected by an emission spectrometer.

12. A method as in claim 7, wherein the second signal indicative of the etching portion is associated with the plasma etching.

13. A method as in claim 7, wherein the second signal indicative of the etching portion is associated with the species of the plasma stemming from the reaction of an etching gas with a substrate.

14. A method as in claim 7, wherein the extracted signal provides information regarding at least one of an etch rate and an end of the etching process.

15. A method of controlling the operation of plasma etching of a substrate in an alternating etching process, which comprises an etching portion and a deposition portion, the method comprising
   sending a first signal to the substrate;
   receiving a signal reflective from the substrate;
   simultaneously detecting a second signal associated with the etching portion of the alternating etching process; and
   using the second signal to extract from the first signal a signal representative of the etching portion within the alternating etching process.

16. A method as in claim 15, wherein the second signal indicative of the etching portion is associated with the plasma etching.

17. A method as in claim 15, wherein the second signal indicative of the etching portion is associated with the species of the plasma stemming from the reaction of an etching gas with a substrate.

18. A method as in claim 15, wherein extracting a signal comprises retrieving a portion of the signal associated with the time that the second signal shows the etching process.

19. A method as in claim 15, wherein the extracted signal provides information regarding at least one of an etch rate and an end of the etching process.

* * * * *